(12) United States Patent
Sun et al.

(10) Patent No.: US 7,396,706 B2
(45) Date of Patent: Jul. 8, 2008

(54) SYNCHRONIZATION TECHNIQUE FOR FORMING A SUBSTANTIALLY STABLE LASER OUTPUT PULSE PROFILE HAVING DIFFERENT WAVELENGTH PEAKS

(75) Inventors: Yunlong Sun, Beaverton, OR (US); Richard Harris, Portland, OR (US); William J. Jordens, Beaverton, OR (US); Lei Sun, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 355 days.

(21) Appl. No.: 11/067,299

(22) Filed: Feb. 25, 2005

(65) Prior Publication Data

US 2006/0126677 A1    Jun. 15, 2006

Related U.S. Application Data

(60) Provisional application No. 60/635,054, filed on Dec. 9, 2004.

(51) Int. Cl.
*B23K 26/36* (2006.01)
*H01L 35/34* (2006.01)
*H01L 21/30* (2006.01)

(52) U.S. Cl. .................. 438/132; 438/940; 219/121.69

(58) Field of Classification Search .................
219/121.67–121.72, 121.76–121.77; 438/128,
438/166, 530, 795, 132, 467, 940; 365/200
See application file for complete search history.

(56) References Cited

U.S. PATENT DOCUMENTS

| | | | |
|---|---|---|---|
| 3,879,686 A | 4/1975 | Milam et al. ........... 331/94.5 M |
| 3,969,684 A | 7/1976 | de Witte et al. ............ 331/94.5 |
| 4,311,360 A | 1/1982 | Hodson et al. .............. 350/174 |
| 4,982,166 A | 1/1991 | Morrow ....................... 330/4.3 |
| 5,231,641 A | 7/1993 | Ortiz ............................ 372/21 |
| 5,307,369 A | 4/1994 | Kimberlin ................... 372/108 |
| 5,315,604 A | 5/1994 | Chiu et al. ..................... 372/25 |
| 5,319,195 A | 6/1994 | Jones et al. ............ 250/227.11 |
| 5,361,268 A | 11/1994 | Fossey et al. ................. 372/23 |
| 5,473,624 A * | 12/1995 | Sun .............................. 372/69 |
| 5,539,764 A | 7/1996 | Shields ......................... 372/57 |
| 5,586,138 A | 12/1996 | Yokoyama ................... 372/97 |
| 5,675,596 A | 10/1997 | Kong et al. ................... 372/25 |
| 5,748,317 A * | 5/1998 | Maris et al. ................. 356/502 |
| 5,756,924 A * | 5/1998 | Early ......................... 102/201 |

(Continued)

FOREIGN PATENT DOCUMENTS

| | | |
|---|---|---|
| EP | 1 422 796 A2 | 5/2004 |
| JP | 63-005891 | 1/1988 |
| JP | 1133765 | 2/1999 |
| WO | WO 2004/098003 A1 | 11/2004 |
| WO | WO 2004/107510 A2 | 12/2004 |
| WO | WO 2006/062744 A2 | 6/2006 |
| WO | WO 2006/063153 A2 | 6/2006 |

OTHER PUBLICATIONS

Bernstein et al., "Metal wire cutting by repeated application of low-power laser pulses," Rev. Sci. Instrum. 63(6) Jun. 1992, pp. 3516-3518.

(Continued)

*Primary Examiner*—Samuel M Heinrich
(74) *Attorney, Agent, or Firm*—Stoel Rives LLP

(57) ABSTRACT

A specially shaped laser pulse energy profile characterized by different laser wavelengths at different times of the profile provides reduced, controlled jitter to enable semiconductor device micromachining that achieves high quality processing and a smaller possible spot size.

20 Claims, 6 Drawing Sheets

U.S. PATENT DOCUMENTS

| | | | | |
|---|---|---|---|---|
| 5,822,355 | A | 10/1998 | Ahn et al. | 372/97 |
| 5,847,960 | A * | 12/1998 | Cutler et al. | 700/187 |
| 5,917,843 | A | 6/1999 | Greene | 372/19 |
| 5,998,759 | A | 12/1999 | Smart | 219/121.69 |
| 6,169,014 | B1 | 1/2001 | McCulloch | 438/487 |
| 6,210,401 | B1 | 4/2001 | Lai | 606/12 |
| 6,252,195 | B1 | 6/2001 | Mosavi et al. | 219/121.69 |
| 6,281,471 | B1 | 8/2001 | Smart | 219/121.62 |
| 6,292,504 | B1 | 9/2001 | Halmos | 372/97 |
| 6,324,195 | B1 | 11/2001 | Suzuki et al. | 372/25 |
| 6,340,806 | B1 | 1/2002 | Smart et al. | 219/121.62 |
| 6,356,575 | B1 | 3/2002 | Fukumoto | 372/97 |
| 6,498,801 | B1 * | 12/2002 | Dudelzak et al. | 372/22 |
| 6,541,731 | B2 | 4/2003 | Mead et al. | 219/121.7 |
| 6,574,250 | B2 | 6/2003 | Sun et al. | 372/25 |
| 6,580,055 | B2 * | 6/2003 | Iso | 219/121.7 |
| 6,580,732 | B1 * | 6/2003 | Guch et al. | 372/18 |
| 6,593,542 | B2 * | 7/2003 | Baird et al. | 219/121.68 |
| 6,664,498 | B2 | 12/2003 | Forsman et al. | 219/121.6 |
| 6,697,394 | B2 | 2/2004 | Tuennermann et al. | 372/22 |
| 6,703,582 | B2 | 3/2004 | Smart et al. | 219/121.62 |
| 6,727,458 | B2 | 4/2004 | Smart | 219/121.62 |
| 6,737,635 | B2 | 5/2004 | Engelhardt et al. | 250/225 |
| 6,878,899 | B2 | 4/2005 | Smart | 219/121.61 |
| 6,879,605 | B2 | 4/2005 | Kyusho et al. | 372/25 |
| 6,887,804 | B2 * | 5/2005 | Sun et al. | 438/130 |
| 6,972,268 | B2 * | 12/2005 | Ehrmann et al. | 438/795 |
| 2001/0021205 | A1 | 9/2001 | Kittelmann et al. | 372/13 |
| 2001/0045419 | A1 * | 11/2001 | Dunsky et al. | 219/121.76 |
| 2002/0050153 | A1 * | 5/2002 | Schultz et al. | 65/377 |
| 2002/0050488 | A1 * | 5/2002 | Nikitin et al. | 219/121.64 |
| 2002/0167581 | A1 * | 11/2002 | Cordingley et al. | 347/173 |
| 2003/0141288 | A1 * | 7/2003 | Mayer | 219/121.73 |
| 2003/0151053 | A1 | 8/2003 | Sun et al. | 257/79 |
| 2004/0100999 | A1 | 5/2004 | Liu | 372/10 |
| 2004/0129685 | A1 | 7/2004 | Arai et al. | 219/121.7 |
| 2004/0134894 | A1 | 7/2004 | Gu et al. | 219/121.68 |
| 2004/0134896 | A1 | 7/2004 | Gu et al. | 219/121.69 |
| 2004/0188399 | A1 | 9/2004 | Smart | 219/121.69 |
| 2005/0041976 | A1 | 2/2005 | Sun et al. | 398/92 |
| 2005/0067388 | A1 | 3/2005 | Sun et al. | 219/121.61 |
| 2005/0092720 | A1 | 5/2005 | Gu et al. | 219/121.69 |
| 2005/0115936 | A1 | 6/2005 | Gu et al. | 219/121.69 |
| 2005/0115937 | A1 | 6/2005 | Gu et al. | 219/121.69 |
| 2005/0117620 | A1 | 6/2005 | Thro et al. | 372/70 |
| 2005/0150879 | A1 | 7/2005 | Gu et al. | 219/121.69 |
| 2005/0150880 | A1 | 7/2005 | Gu et al. | 219/121.69 |
| 2005/0254530 | A1 | 11/2005 | Sun | 372/22 |
| 2005/0271094 | A1 * | 12/2005 | Miller et al. | 372/25 |
| 2006/0056469 | A1 * | 3/2006 | Huhse et al. | 372/30 |
| 2006/0128073 | A1 | 6/2006 | Sun et al. | 438/132 |

OTHER PUBLICATIONS

North et al., Laser Coding of Bipolar Read-Only Memories, IEEE Journal of Solid State Circuits, vol. SC-11, No. 4 (1976).

English Abstract and Purported English Translation of Japanese Publication No. 63-005891.

* cited by examiner

SYNCHRONIZATION TECHNIQUE FOR FORMING A SUBSTANTIALLY STABLE LASER OUTPUT PULSE PROFILE HAVING DIFFERENT WAVELENGTH PEAKS

RELATED APPLICATION

This application claims benefit of U.S. Provisional Patent Application No. 60/635,054, filed Dec. 9, 2004.

COPYRIGHT NOTICE

© 2005 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71 (d).

TECHNICAL FIELD

The inventions relate generally to laser processing multilayer workpiece materials and, in particular, using a substantially jitter free, multiple-wavelength laser energy profile targeted for semiconductor device micromachining to achieve high quality processing and a smaller possible spot size in which laser energies at the multiple wavelengths can or may overlap within the laser energy profile.

BACKGROUND OF THE INVENTION

Yields in IC device fabrication processes are often impacted by defects resulting from alignment variations of subsurface layers or patterns, particulate contaminants, or defects in the substrate material itself. FIGS. 1, 2A, and 2B show repetitive electronic circuits 10 of an IC memory device or workpiece 12 that are typically fabricated in rows or columns to include multiple iterations of redundant circuit elements 14, such as spare rows 16 and columns 18 of memory cells 20. With reference to FIGS. 1, 2A, and 2B, circuits 10 are also designed to include particular laser severable circuit links 22 between electrical contacts 24 that can be removed to disconnect a defective memory cell 20, for example, and substitute a replacement redundant cell 26 in a memory device such as a DRAM, an SRAM, or an embedded memory. Similar techniques are also used to sever links to program a logic product, gate arrays, or ASICs.

Links 22 are designed with conventional link widths 28 of about 1.0 micron, link lengths 30, and element-to-element pitches (center-to-center spacings) 32 of about 1.5 microns or less from adjacent circuit structures or elements 34, such as link structures 36. Link dimensions and pitches are continually being reduced by device manufacturers. Although the most prevalent link materials have been polysilicon and like compositions, memory manufacturers have more recently adopted a variety of more conductive metallic link materials that may include, but are not limited to, aluminum, copper, gold nickel, titanium, tungsten, platinum, as well as other metals, metal alloys such as nickel chromide, metal nitrides such as titanium or tantalum nitride, metal suicides such as tungsten silicide, or other metal-like materials.

Circuits 10, circuit elements 14, or cells 20 are tested for defects. The links to be severed for correcting the defects are determined from device test data, and the locations of these links are mapped into a database or program. Laser pulses have been employed for more than 20 years to sever circuit links 22. FIGS. 2A and 2B show a laser spot 38 of spot size diameter 40 impinging a link structure 36 composed of a link 22 positioned above a silicon substrate 42 and between component layers of a passivation layer stack including an overlying passivation layer 44 (shown in FIG. 2A but not in FIG. 2B) and an underlying passivation layer 46 (shown in FIG. 2B but not in FIG. 2A). FIG. 2C is a fragmentary cross-sectional side view of the link structure of FIG. 2B after the link 22 is removed by the laser pulse.

The prior art uses laser pulses comprised of only a single laser wavelength for semiconductor device link processing. A single laser pulse at a 1064 nm or 1047 nm wavelength has been widely used for semiconductor memory chip link on-the-fly processing, which entails severing individual links with a single pulse for each link while not stopping beam positioner motion. A laser pulse at 1320 nm became preferable later in metal link processing because it caused less damage to a silicon substrate. Link processing with a UV laser pulse also has been proposed and practiced. Double pulse processing of fat (i.e., thick) copper links has been attempted by a few users. All of the laser pulses used were at the same wavelength.

Wavelengths advantageous for minimizing silicon substrate damage and enhancing a process window are near 1300 nm, as disclosed in U.S. Pat. No. 5,265,114, which is assigned to the assignee of this patent application. However, the smallest practical laser beam spot size at 1300 nm is about 1.7 microns. The ever-shrinking feature size or link dimensions of semiconductor memory chips demand a laser beam spot size of 1.4 microns and smaller. Using a short wavelength in the UV spectral range, as disclosed in U.S. Pat. No. 6,057,180, which is assigned to the assignee of this patent application, can deliver the small beam spot size needed and cut through an overlying passivation layer but requires that the passivation material absorb the UV wavelength to protect the silicon substrate. Moreover, the link structure design should cooperate with the underlying passivation layer structure to inflict only minor damage to the underlying passivation material. Using a short wavelength in the green/visible range would carry a high risk of damage to the silicon substrate because of its high absorption of wavelengths in the green/visible range.

What is desired for purposes of semiconductor device micromachining is a series of special laser pulses, each with an energy profile comprised of different laser wavelengths at different times within the energy profile sequenced to the different processing characteristics of the layers in the multilayer structure. One such energy profile sequence would be a first part of the laser pulse energy profile at a UV or green wavelength to best process the overlying passivation layer and top part of the link material, followed by a second part of the laser pulse energy profile at a 1.3 micron wavelength to clear the remaining link material while limiting risk of damage to the underlying passivation layer and silicon wafer substrate.

SUMMARY OF THE INVENTION

Preferred embodiments of the inventions entail the use of laser pulses of different wavelengths propagating from two or more lasers to form a laser pulse with an energy profile comprised of different laser wavelengths at different times within the energy profile, with little or no jitter, for incidence on and processing multilayer structures. The other laser parameters may be the same or different. Semiconductor device link processing is described as a preferred embodiment with reference to link cutting. The use of laser pulses in accordance with the inventions described with reference to preferred embodiments is also applicable to other laser processing operations, such as via drilling. Typically, a first part of the laser pulse energy profile is at a short wavelength, such as UV or green wavelength, and is followed by a second part of the laser pulse energy profile at a longer wavelength, such as visible or IR wavelength. The time delay between the UV/green laser energy and the visible/IR laser energy is controllable based on the process and target structure. The UV/green laser energy cuts or ruptures the overlying passivation layer and removes part of the link material; then the subsequent visible/IR laser energy removes the remaining link material. Use of the visible/IR laser energy carries much less risk of damage to the underlying passivation layer. Because less visible/IR laser energy is needed after the link structure has been partly processed by the UV or green laser pulse, there is much less risk of damage to the silicon wafer substrate by the visible/IR laser pulse.

Processing a semiconductor device link in accordance with the inventions is characterized by several features or aspects. The first is a formation of the laser pulse with desired energy profile comprised of different laser wavelengths at different times. The energy profile is well controlled, and there is little or no time jitter between laser energies at the different laser wavelengths, to keep the overall laser pulse energy profile stable. The second is selection of different preferred laser energy levels and wavelengths at different link processing stages of the link structure, such as first using the UV or green laser energy and thereafter using the visible/IR laser energy. The third is a link processing system implemented to process a semiconductor device link on the fly, with the laser pulse comprised of the desired energy profile and wavelength division.

The inventions enable processing of links with narrower link widths, denser pitch sizes, higher thickness-to-width ratios, as well as more complicated passivation layer structures and process fragile passivation materials. In the case of a laser pulse comprised of UV and visible laser energy, the leading UV laser energy processes the overlying passivation layer with less risk of creating a large crater or causing formation of cracks in the passivation structure, and the trailing visible/IR laser energy removes the remaining link material with less risk of damage to the underlying passivation layer and silicon substrate. When the visible laser energy is chosen in the green and blue spectrum, the total effective laser beam spot size is greatly reduced compared with the prior art of using single laser wavelength at IR. The parameters of the UV and IR/visible laser energies and their timing can be adjusted for best results, based on the link structure.

Substantially jitter-free formation of a laser pulse with an energy profile comprised of different laser wavelengths provides a stable and unique laser energy profile with multiple energy peaks at different wavelengths with reduced, controlled time jitter. Reducing laser pulse profile jitter through synchronous drive signals to the respective generators of laser energy at different wavelengths, initiation of laser energy buildup at different laser wavelength by injection locking, or both, enables controllable time-displaced wavelength peaks of short inter-peak separation.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
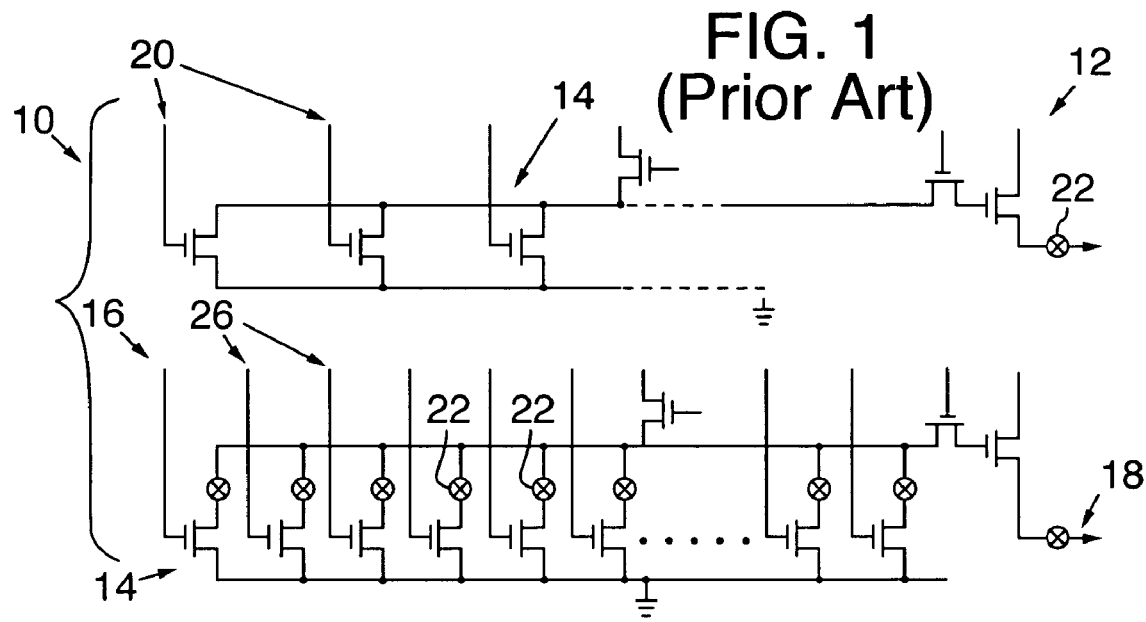
FIG. 1 is a schematic diagram of a portion of a DRAM showing the redundant layout of and programmable links in a spare row of generic circuit cells.
Figure 2A:
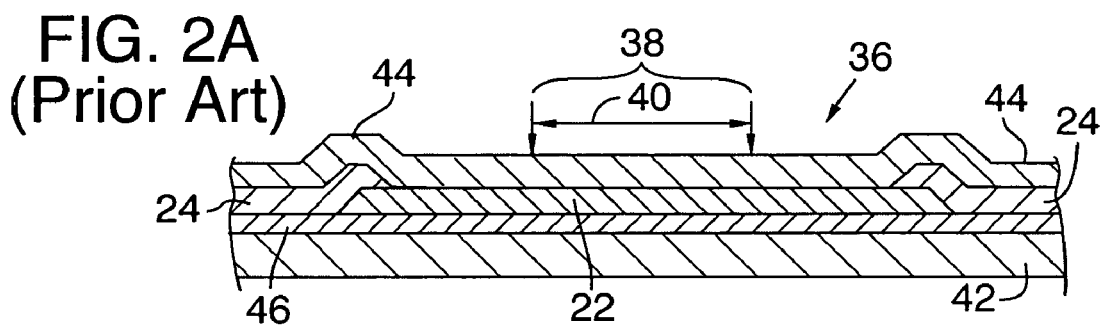
FIG. 2A is a fragmentary cross-sectional side view of a conventional, large semiconductor link structure receiving a laser pulse characterized by prior art pulse parameters.
Figure 2B:
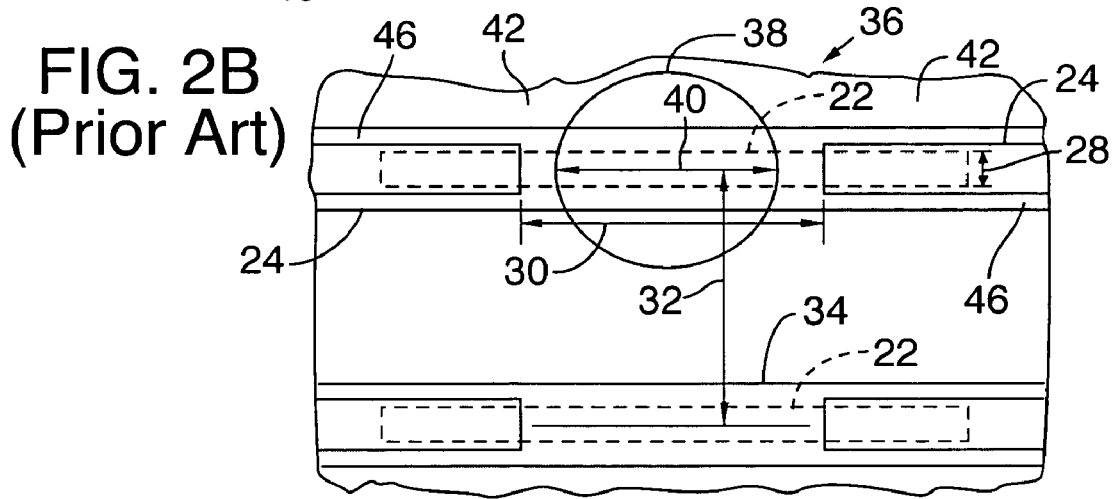
FIG. 2B is a fragmentary top view of the link structure and the laser pulse of FIG. 2A, together with an adjacent circuit structure.
Figure 2C:
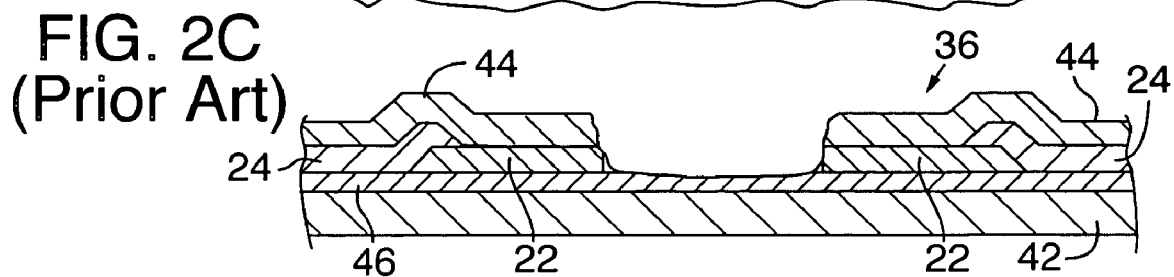
FIG. 2C is a fragmentary cross-sectional side view of the link structure of FIG. 2B after the link is removed by the prior art laser pulse.

Preferred embodiments use two laser heads from which propagate laser pulse energies at different wavelengths, together with other laser parameters that are either the same or different, to form a specially shaped laser energy profile with multiple energy peaks at different laser wavelengths to process an electrically conductive link on an integrated circuit chip of the type shown in FIGS. 1 and 2A-2C.

One preferred embodiment entails the use of laser energy propagating from a UV harmonic wavelength laser head at the beginning of the laser energy profile, which occurs at the beginning of a process timing sequence, followed by laser energy from a visible wavelength laser head, such as a green or blue laser. The time delay between the UV laser energy peak and the visible laser energy peak is controllable, based on the process and target structure, and can practically be from 0 ns to 300 ns-500 ns. Within the 500 ns time range, a beam positioning system (not shown) moves less than 0.1 micron; therefore, the two laser energy peaks within the laser energy profile are incident on the same link width on-the-fly (i.e., the positioning system is kept in motion), as in the case of a single laser pulse.

Because of absorption by the passivation material of the UV laser energy, the UV laser energy either directly cuts through the passivation layer overlying the link or the overlying passivation layer undergoes an increase in temperature along the laser beam path, thereby resulting in a reliable and consistent rupture of the overlying passivation layer without introducing cracks in the passivation layer structure. This is especially important when the link width is narrow, link thickness-to-width ratio is high, and passivation layer structure is weak at the bottom of the link, or the passivation layer is made of fragile low k material, such as SiLK.

The UV laser energy is chosen such that it ruptures the overlying passivation layer and removes part of the link material to form part of an open volumetric region. There is a part of the link material remaining after completion of the UV segment of the laser pulse energy profile. The center of the UV laser beam, where the laser intensity is the highest, is not directly incident on the underlying passivation layer and the silicon wafer substrate; therefore, both are well protected by a link material "shield" from damage by the UV laser energy. This "first stage" of the laser pulse energy profile for processing link structures, ruptures the overlying passivation layer and removes a part of the link material. Alternatively, laser energy at the green spectrum can be chosen at the beginning of the laser pulse energy profile because of its better energy coupling efficiency to the conductive link material. A short rise time of the laser pulse energy profile at the beginning of the link process is advantageous in that it will rupture the overlying passivation sooner, leaving less time for the underlying passivation to crack before rupturing.

The "second stage" of the laser pulse energy profile to process link structures uses the longer wavelength of visible green or blue laser energy to remove all of the remaining link material. Since the visible laser energy needs only to finish the second stage of the link process, i.e., remove the link material remaining after the UV laser pulse process and thereby complete formation of the open volumetric region, the amount of laser energy needed is much less than that which otherwise would be needed for traditional link processing with a single laser pulse of a single laser wavelength. As a consequence, the risk of damage to the silicon wafer substrate by the visible laser pulse is greatly reduced. On the other hand, there is little risk of damage to the underlying passivation layer by this laser pulse at a visible wavelength because the underlying passivation material does not absorb it.

Both of the laser heads emitting the laser energies preferably operate at the same repetition rate and are well synchronized to each other. A typical laser pulse repetition rate for link processing ranges from 1 KHz to 200 KHz or greater. For different applications, the laser pulse repetition rate can be lower than 1 KHz (as low as 1 Hz) or higher than 200 KHz. For link processing, each of the two or more laser energies from which the one laser pulse profile is formed ranges from less than 0.001 uJ to about 20 uJ, with each of their duration times ranging from 100 fs to a few tens of ns.

Another preferred embodiment entails the use of a laser pulse energy profile comprised of 1064 nm or 1320 nm laser energy and its second or third harmonic (532 nm and 660 nm, 355 nm and 440 nm, respectively) laser energy to sever an electrically conductive link. By properly selecting the energy and timing of each laser wavelength making up the laser pulse energy profile, the link can be severed while preventing damage to neighboring links or the silicon wafer substrate.

Table 1 presents absorption data for common semiconductor device link metals at different wavelengths.

TABLE 1

|  | 1320 nm | 660 nm | 532 nm |
| --- | --- | --- | --- |
| Al | 3% | 9% | 9% |
| Cu | 2.5% | 5% | 25% |
| W | 40% | 50% |  |

Table 1 indicates that, if the original energy value needed to process a copper link with 1320 nm is E, then with a mixture of 660 nm and 1320 nm, the new 1320 nm energy value can be 50% E and the 660 nm energy value can be roughly 25% E. With respect to damage to a nearby link structure, the 1320 nm energy has the larger spot size of the two applied energies and thereby presents a greater risk of damage. However, for a Gaussian-shaped beam, a 1320 nm energy at 50% E incident on any part of the link structure presents, from a damage point of view, an effective beam spot size that is 80% of the beam spot size of a 1320 nm energy at 100% E. With properly designed focusing optics, the effective laser beam spot size of the 660 nm laser energy at 25% E can be equal to or smaller than the laser beam spot size of the 1320 nm laser energy at 50% E.

With respect to damage to a silicon wafer substrate, 660 nm laser energy at 25% E is well below the damage threshold of the silicon substrate. Adding another 50% E at 1320 nm leaves sufficient head room so as to not damage the silicon wafer substrate. This energy percentage mix can be readily adjusted for different link structures. For instance, it can be 40%-20% E for 660 nm energy and 20%-60% E for 1320 nm energy.

Other preferred embodiments entail the use of different wavelength mixtures. In addition to the mixture of 1320 nm and 660 nm laser energies, other mixtures can also be 1320 nm and 330 nm (its fourth harmonic) energies or 1064 nm energy and a shorter laser wavelength energy, such as 532 nm, 355 nm, and 266 nm, all of which are the harmonics of 1064 nm emissions from a Nd:YAG or Nd:YVO laser.

Mixing the fundamental wavelength with its second harmonic is advantageous because it simplifies the focusing lens design. Creating a dual-wavelength lens that can deliver desired beam spot size for the two wavelengths is easier when dealing with the fundamental wavelength and its second harmonic, rather than the fundamental and its third or fourth harmonic.

A preferred embodiment entailing the use of a mixture of UV and 1320 nm laser energies offers another advantage in that the UV laser energy can help to directly open the overlying passivation layer. This is quite desirable for severing links with very narrow link widths. The UV laser can be a third harmonic of Nd:YAG, Yb:YAG, Nd:YVO, Nd:YLF laser or Nd,Yb doped fiber laser at 355 nm, 351 nm, or 349 nm or other wavelengths in the UV spectrum. The green laser can be a second harmonic of Nd:YAG, Yb:YAG, Nd:YVO, Nd:YLF laser or Nd,Yb doped fiber laser at 532 nm, 526 nm, or 523 nm or other wavelengths in the green spectrum. The blue laser can be a third harmonic of a Nd:YAG or Nd:YLF laser at 440 nm from 1320 nm or other laser source. A shorter laser wavelength in the visible spectrum is preferred, such as 400 nm, because a visible wavelength closer to the UV wavelength (355 nm) facilitates focusing of the mixed laser energy to a smaller beam spot size.

Other preferred laser wavelength mixtures can be green and 1320 nm, green and 1064 nm, 1064 nm and 1320 nm, 1064 nm and 1047 nm, and 1320 nm and 1047 nm. The green and 1300 nm mixture could be very useful in processing a "fat (thick) copper link," for which the beam spot size is not the most critical issue. The green laser pulse accelerates heating of the top part of the link, thereby helping to rupture the overlying passivation with less risk of generating cracks elsewhere in the passivation material. After the green laser energy ruptures the overlying passivation layer and removes a part of the link material, the 1320 nm laser energy finishes the link process. Since the remaining link material has been heated by the green laser energy, the absorption of the link material at 1320 nm will be greatly improved, which in turn reduces the required laser energy at the 1320 nm. Moreover, the silicon wafer substrate has a much lower absorption coefficient at 1320 nm. All these factors add up and result in much less risk of damage to the silicon wafer substrate by the laser energy used. For a mixture of UV laser wavelength and blue or green laser wavelength, the UV wavelength can be 355 nm, 266 nm, or a shorter wavelength.

Figure 3:
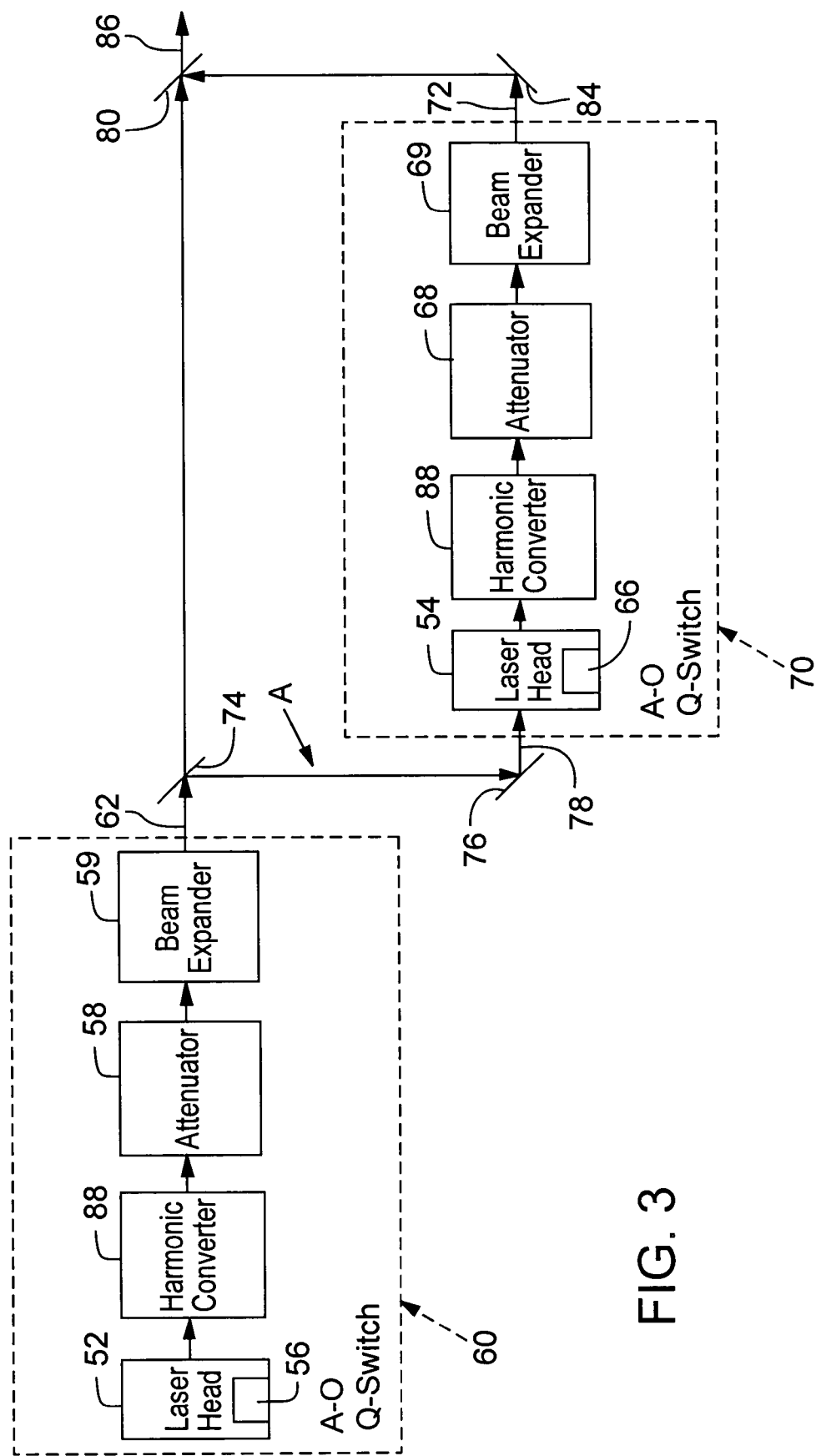
FIG. 3 is a simplified general block diagram of a laser system embodiment configured with two laser heads coupled by injection locking, the outputs of which are used to form a pulsed laser output beam with a pulse energy profile comprised of two different wavelengths.

FIG. 3 shows one embodiment of a system 50 for using the outputs of two laser heads 52 and 54 operating at different laser wavelengths to form the specially shaped laser output pulse energy profile. System 50 is preferably, but need not be, implemented with injection locking to reduce laser output jitter for forming a reliable and stable pulse energy profile. Jitter reduction is advantageous when the output energies of the two laser heads partly temporally overlap to form a laser pulse energy profile with separate, different wavelength peaks. In embodiments in which the output energies temporally overlap, the specially shaped energy pulse profile has characteristics corresponding at least in part to characteristics of the output energies of the two laser heads. The sources of and techniques for reducing the jitter are described with reference to FIGS. 6A, 6B, 7, and 8 below.

System 50 is composed of two laser heads 52 and 54 that emit laser output. Laser head 52, which is composed of a lasant (not shown), pumping source (not shown), and a high-speed shutter device such as a Q-switch 56, generates a pulsed laser output beam of a desired energy profile. Laser head 52 and optional attenuator 58 and beam expander 59 components form a laser rail 60 from which propagates a pulsed output beam 62 of laser energy. Similarly, laser head 54, which is composed of a lasant (not shown), pumping source (not shown), and a high-speed shutter device such as a Q-switch 66, generates a pulsed laser output beam of a desired energy profile. Laser head 54 and optional attenuator 68 and beam expander 69 components form a laser rail 70 from which propagates a pulsed output beam 72 of laser energy. Skilled persons will appreciate that the laser output wavelength and other laser parameters dictate the specific design and configuration of the components of laserheads 52 and 54. Beam 62 of laser output of laser rail 60 is incident on a beam splitter 74, which in cooperation with a mirror 76 directs for injection locking a small portion 78 of the energy of laser beam 62 to laser head 54 and by direct transmission passes the remainder of the laser energy of laser beam 62 to a beam combiner 80. A beam 72 of laser output of laser rail 70 produced partly in response to the injected laser energy reflects off a mirror 84 for incidence on beam combiner 80. Beam combiner 80 receives the series of pulsed laser output of laser rails 60 and 70 to form a pulsed output beam 86 characterized by a desired laser pulse energy profile for incidence on a multilayer structure intended to undergo a micromachining process. An optional harmonic converter 88 may be associated with a beam of laser head output pulses before their incidence on beam combiner 80. The details of system operation, as well as the details of other system embodiments, are fully described below.

Figure 4A:
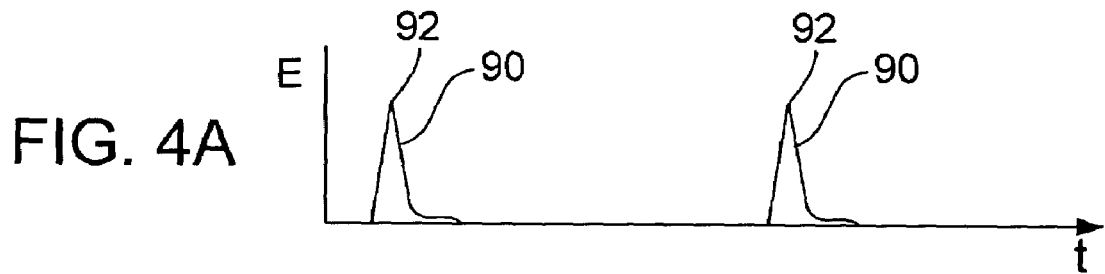
FIGS. 4A and 4B show an example of series of laser energies at different laser wavelengths used to form the specially shaped laser pulse energy profile shown in FIG. 4C, in which there are two partly overlapped energy peaks at different wavelengths from the two laser heads of FIG. 3.
Figure 4B:
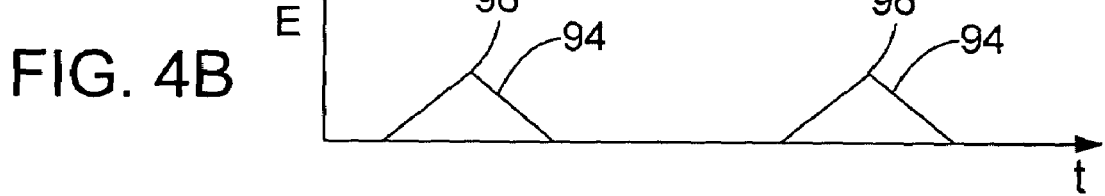
Figure 4C:
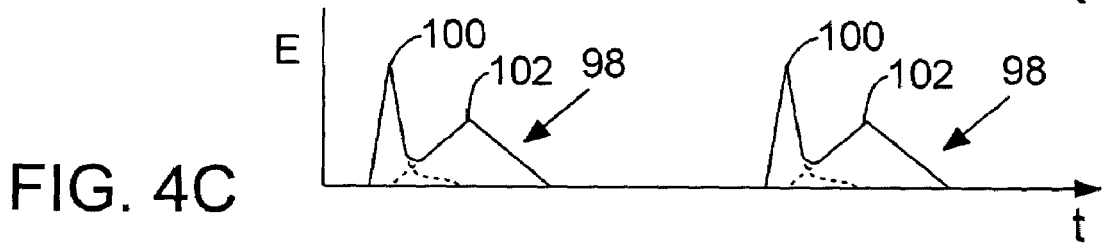

FIGS. 4A, 4B, and 4C show one example of the synthesis of the laser pulse energy profile formed by partly temporally overlapping laser outputs 62 and 72. FIG. 4A shows a series of pulse spikes 90 produced by laser rail 60. The energy profile of each pulse spike 90 exhibits a rapid rise time and a peak energy level 92 suitable for rupturing target link material. FIG. 4B shows a series of pulse spikes 94 produced by laser rail 70. Pulse spikes 94 are of longer duration than and are delayed relative to pulse spikes 90 such that the series of pulse spikes 90 and 94 partly temporally overlap. The energy profile of each pulse spike 94 exhibits a relatively gradual rise time and a peak energy level 96 suitable for removing target material in the opening formed by rupture of target link material caused by pulse spikes 90. The rise time of pulse spikes 94 is longer than that of pulse spikes 90, and the energy of pulse spikes 94 is less than that of pulse spikes 90. The durations of pulse spikes 90 and 94 each range from about 1 ps to about 100 ns. FIG. 4C shows two of a series of laser pulse profiles 98 produced at the output of beam combiner 80. Beam combiner 80 can be based on polarization or on simple partial transmission and reflection such as 50%-50% or 40%-60%, based on the requirement of the energy of pulse spike 90 and the energy of pulse spike 94. The relative positions of peaks 92 and 96 of the respective pulse spikes 90 and 94 depend on the time displacement between them. Such time displacement can be realized by, for example, specifying the proper different Q-switch firing times for laser heads 52 and 54, together with the proper length of an optical fiber along path "A"shown in FIG. 3. FIG. 4C shows an overlap of pulse spikes 90 and 94 that form a series of single pulses 98, each with two peaks 100 and 102 characterized by the times of occurrence and peak energy levels of the energy profiles of the respective pulse spikes 90 and 94. The delay time between peaks 100 and 102 is between about zero and about 500 ns. The leading edge rise time of peak 100 is shorter than about 10 ns, and the total duration of laser pulse profile 98 is longer than about 5 ns.

Figure 5A:
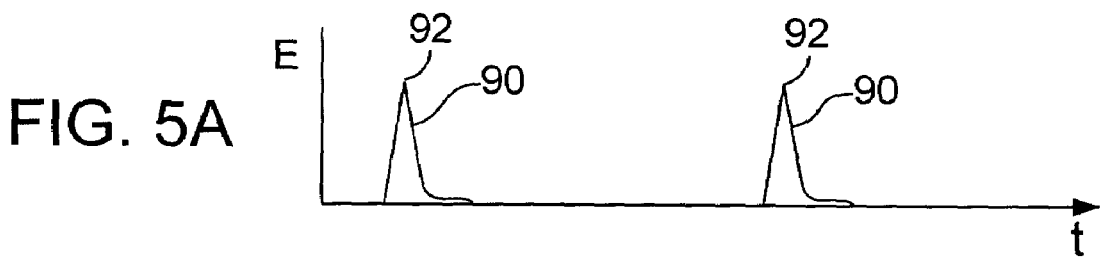
FIGS. 5A, 5B, and 5C show an example of series of laser energies at different laser wavelengths used to form a specially shaped laser pulse energy profile of two nonoverlapped energy peaks at different wavelengths from the two laser heads of FIG. 3.
Figure 5B:
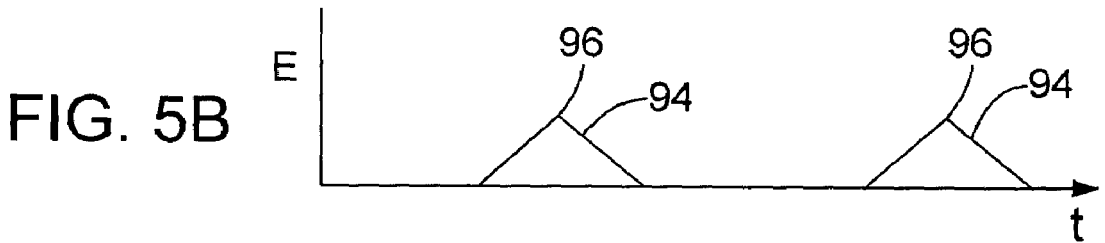
Figure 5C:
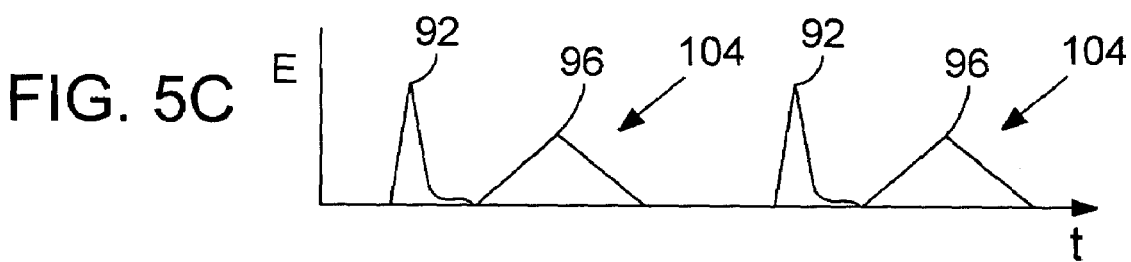

FIGS. 5A, 5B, and 5C show one example of using series of separate laser pulse energy profiles to form a beam of temporally nonoverlapping pulsed laser outputs 62 and 72. The series of pulse spikes 90 of FIGS. 4A and 5A are the same, and the series of pulse spikes 94 of FIGS. 4B and 5B are the same. The time displacement of corresponding pulse spikes 90 and 94 is, however, sufficiently large that they do not overlap. FIG. 5C shows a combined series 104 of alternating, nonoverlapping pulse spikes 90 and pulse spikes 94, the respective peak energy levels 92 and 96 of which are portions of separate, nonoverlapping pulses.

Semiconductor link processing using a laser pulse energy profile comprised of two different wavelengths at different processing stages can be accomplished at a higher laser power or a higher laser pulse repetition rate, or extended to more than two different laser wavelengths, by employing multiple laser heads and using polarization sensitive components or other components as beam combiner 80.

Although there exist prior art techniques for combining laser pulses propagating from multiple laser heads, there is no discussion of the issue of laser pulse jitter during the pulse combination. Laser pulse jitter is the random fluctuation of the laser pulse timing relative to the laser pulse control signal. For a typical diode-pumped solid state (DPSS) laser used in laser link processing, laser pulse jitter is in the range of 5 ns-30 ns. This means that one cannot practicably stabilize the shape of laser pulse energy profile when two corresponding pulses propagating from two laser heads are time displaced by an amount similar to the range of the pulse jitter.

Solving the problem of laser pulse jitter enables realization of a laser pulse with energy profile comprised of two or more different laser wavelengths with high accuracy and stability of the profile. Laser energy propagating from two laser heads and separated by a time interval ranging from zero to a few hundred nanoseconds can, therefore, be utilized to generate a composite laser pulse with a stable laser pulse energy profile shape useful for a variety of applications. This aspect of the invention substantially eliminates laser output jitter between multiple laser heads and thereby enables use of a higher laser power, higher laser pulse repetition rate, or specially configured laser pulse shape.

Figure 6A:
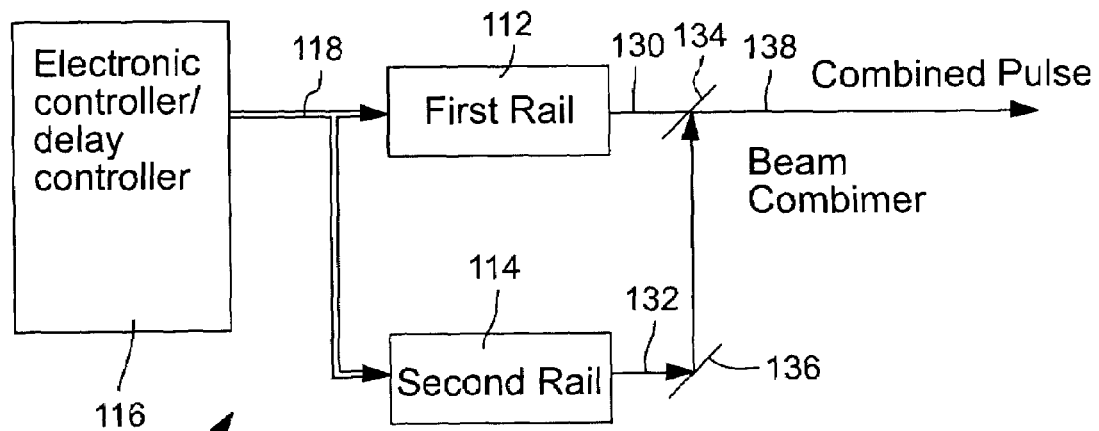
FIG. 6A is a simplified general block diagram of a prior art system for combining the outputs of two pulsed lasers.

Laser pulse jitter comes primarily from two sources, the laser driving electronics and the laser itself. A review of traditional laser driving electronics sets up the causes of the laser pulse jitter problem solved by the particular inventions described below. FIG. 6A shows a prior art system 110 configured for laser pulse combination. System 110 includes DPSS laser rails 112 and 114 configured with acousto-optic (A-O) Q-switches. An electronic controller/delay controller 116 provides at outputs 118 acousto-optic Q-switch RF signals and laser pulse demand control signals to laser rails 112 and 114, which in response emit respective pulsed laser output beams 130 and 132. Output beam 130 propagates directly for incidence on a beam combiner 134, and output beam 132 propagates by reflection off a mirror 136 for incidence on beam combiner 134. Beam combiner 134 receives and combines pulsed laser output beams 130 and 132 to form a coaxial beam 138 of laser pulses.

For an acousto-optic Q-switched solid state laser to realize a higher laser pulse-to-pulse stability, the acousto-optic Q-switch RF signal is cut off only when it crosses a preselected trigger point, which in preferred embodiments is a zero voltage level, to fire a laser pulse. For example, if the Q-switch RF signal frequency is 48 MHz, the time difference between two consecutive Q-switch RF signal zero crossing points is about 10 ns. Since the laser pulse timing demand control signal is random and is asynchronous to the Q-switch RF signal, the actual Q-switch RF signal cut-off occurring in response to the laser pulse timing demand control signal has a random timing uncertainty of 10 ns. When two similar laser rails are used for pulse combination, the pulse jitter between the two laser pulses propagating from the laser rails will be 20 ns.

Figure 6B:
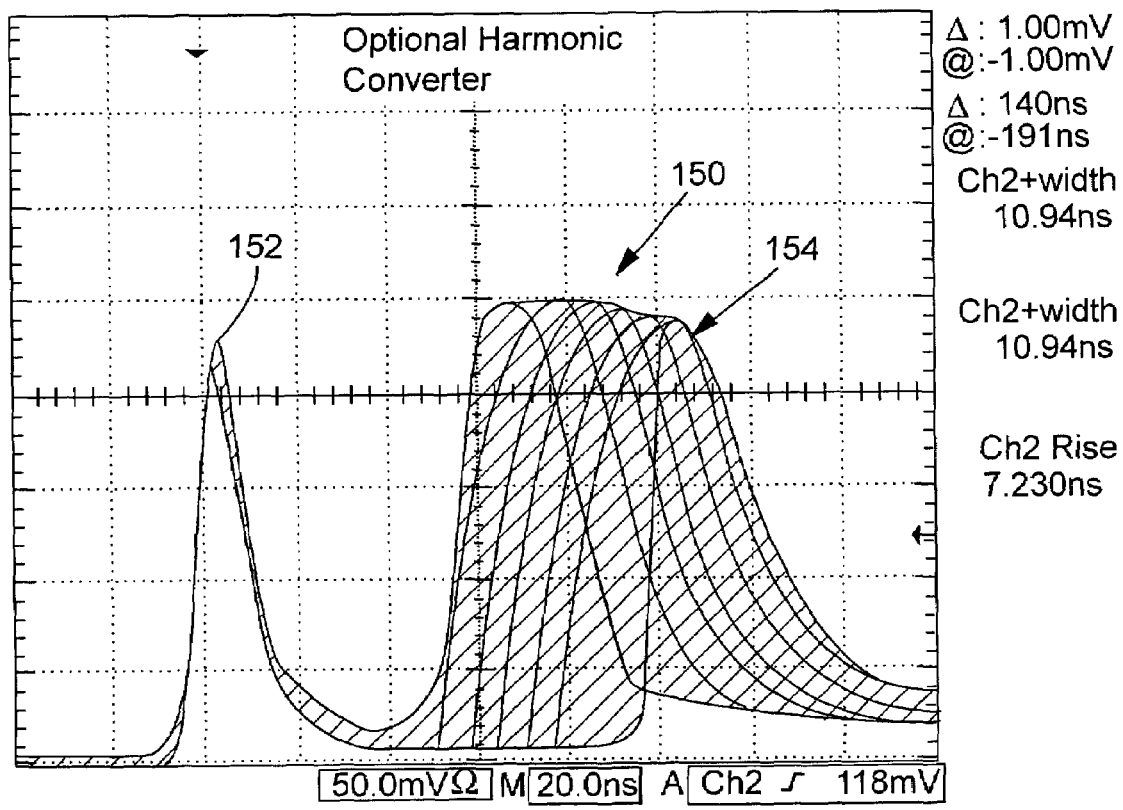
FIG. 6B is an oscilloscope trace showing the effects of laser pulse jitter exhibited by the prior art laser pulse combination system of FIG. 6A.
Figure 7:
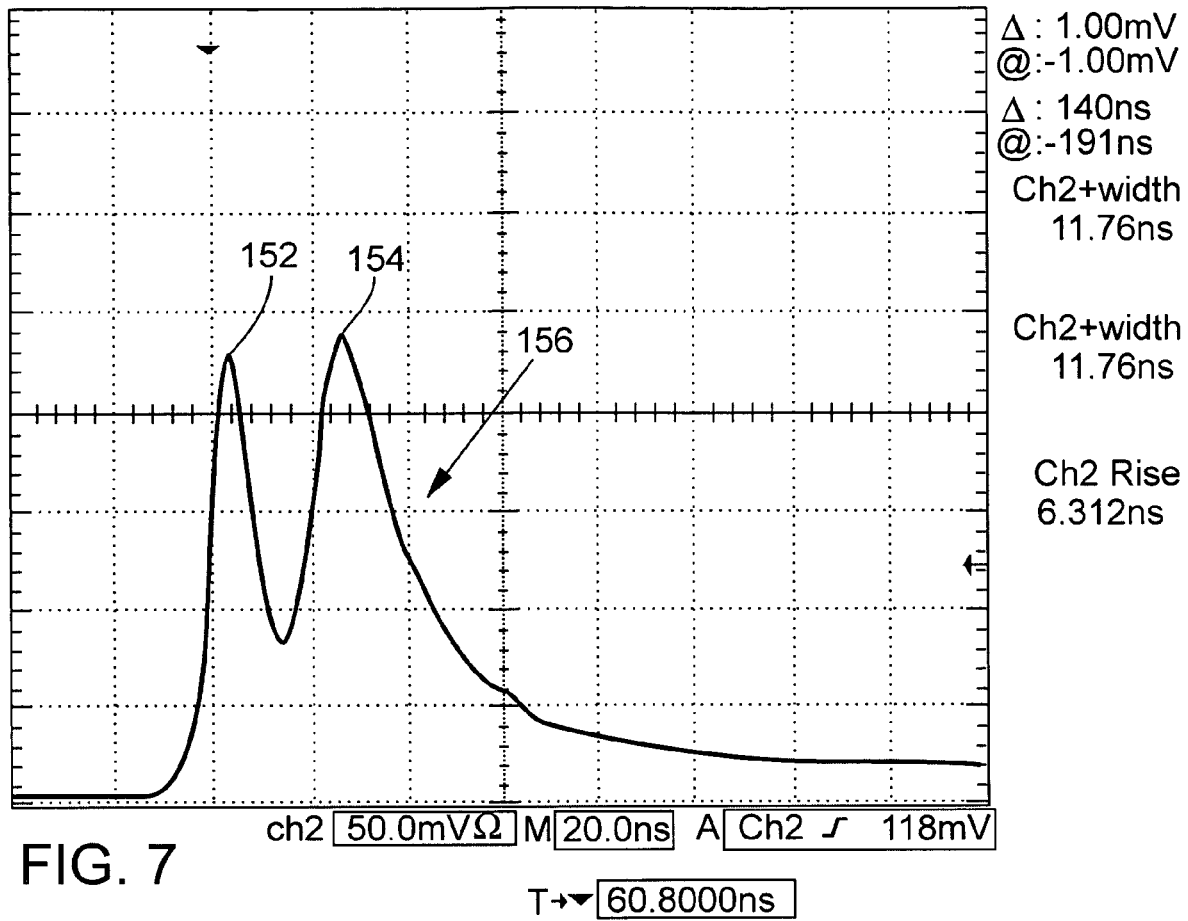
FIG. 7 is an oscilloscope trace showing the laser energy profile realized by a laser pulse generation system implemented in accordance with the present inventions.

FIG. 6B shows the laser pulse jitter present in the laser pulse combination coaxial beam 138 formed in accordance with the prior art. Specifically, FIG. 6B shows an oscilloscope trace 150 representing coaxial beam 138 formed by combining many occurrences of a 12-ns wide laser pulse 152 of output beam 130 and a 23-ns wide laser pulse 154 of output beam 132. The average time delay between adjacent 12 ns-wide and 23 ns-wide laser pulses is 60 ns, and the combined laser pulse jitter between them is about 50 ns. FIG. 7 is an oscilloscope trace 156 showing the desired laser energy profile shape of the laser pulse that is the combination of laser output 152 with a pulse width of 12 ns and laser output 154 with a pulse width of 23 ns, with a time delay of 10 ns between them. Laser outputs 152 and 154 of FIG. 7 correspond to the respective laser pulses 152 and 154 described with reference to FIG. 6B, except for the difference in average delay time between them. It is apparent that laser pulse jitter makes the prior art laser pulse combination technique impractical.

Figure 8:
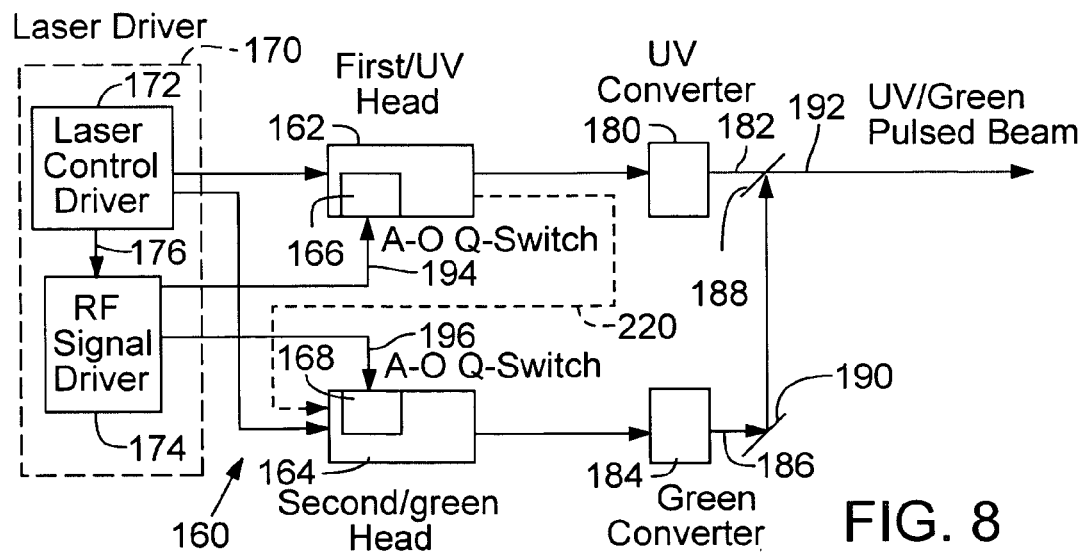
FIG. 8 is a simplified block diagram of a laser pulse generation system embodiment configured with synchronized RF drive signals applied to the Q-switches of two laser heads, the outputs of which form pulsed laser energy characterized by stable output energy profile features at different wavelengths.

To reduce laser pulse jitter stemming from the laser driving electronics, an embodiment of a laser system 160, which is shown in FIG. 8, implements a design in which the acousto-optic Q-switches associated with the multiple lasers are driven by synchronized drive signals developed by a common RF signal driver. System 160 includes DPSS laser heads 162 and 164 configured with respective acousto-optic Q-switches 166 and 168. A laser driver subsystem 170 composed of a laser control signal driver 172 and an RF signal driver 174 controls the operations of laser heads 162 and 164. Laser control signal driver 172 provides laser pulse timing demand control signals 176, and RF signal driver 174 provides in response to them synchronized RF signals to acousto-optic Q-switches 166 and 168. An ultra-violet light wavelength converter 180 associated with laser head 162 provides a pulsed UV laser output beam 182, and a green light wavelength converter 184 associated with laser head 164 provides a pulsed green laser output beam 186. UV laser output beam 182 propagates directly for incidence on a beam combiner 188, and green laser output beam 186 propagates by reflection off a mirror 190 for incidence on beam combiner 188. Beam combiner 188, which is highly transmissive of UV light and highly reflective of green light, receives and combines UV and green laser output beams 182 and 186 to form a beam 192 of laser pulses. Different lengths of RF coaxial cables 194 and 196 between RF signal driver 174 and the respective acousto-optic Q-switches 166 and 168 can be used to provide the delay time between the corresponding laser pulses of output beams 182 and 186 propagating from the different laser heads 162 and 164.

With this design, when laser pulses are requested by laser pulse timing demand control signals 176, both laser energies are fired when both RF drive signals applied to acousto-optic Q-switches 166 and 168 are at a zero voltage level crossing, i.e., not random relative to the RF drive signal level, to maintain high laser output amplitude stability. However, even if the Q-switch RF signal cut-off exhibits a time jitter of the same 10 ns relative to laser pulse timing demand control signal 176, there is no relative pulse jitter as between the laser pulses because of the synchronization of both RF drive signals applied to acousto-optic Q-switches 166 and 168. Thus, a stable laser pulse energy profile is achievable with accurate timing between the laser pulse peaks. An operational tolerance of laser stability within about ±10% is achievable.

Figure 9A:
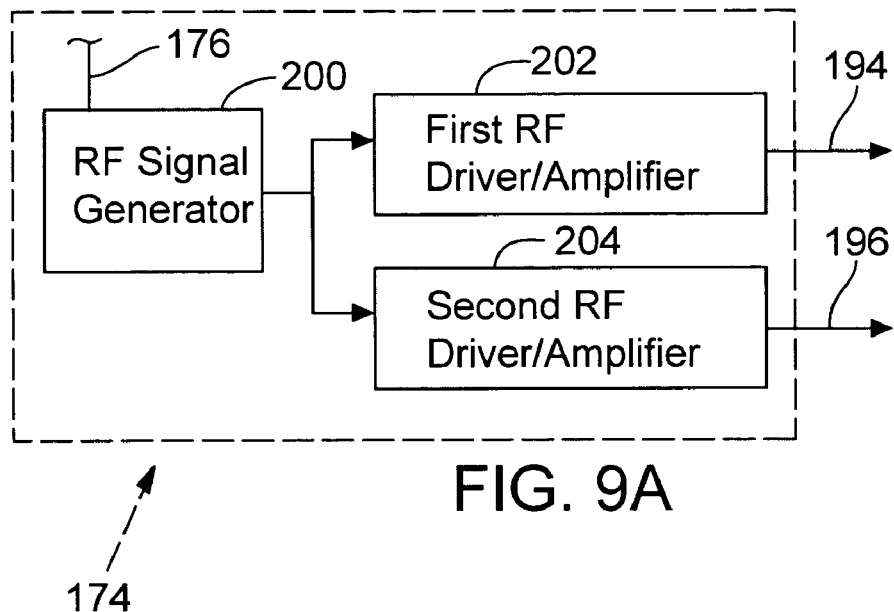
FIGS. 9A and 9B show alternative implementations of the RF signal driver of FIG. 8.

FIG. 9A shows an implementation of RF signal driver 174 composed of an RF signal generator 200 providing a common Q-switch RF signal to a first RF driver/amplifier 202 and a second RF driver/amplifier 204. RF driver/amplifier 202 provides the RF drive signal along coaxial cable 194 to acousto-optic Q-switch 166, and RF driver/amplifier 204 provides the RF drive signal along coaxial cable 196 to acousto-optic Q-switch 168.

Figure 9B:
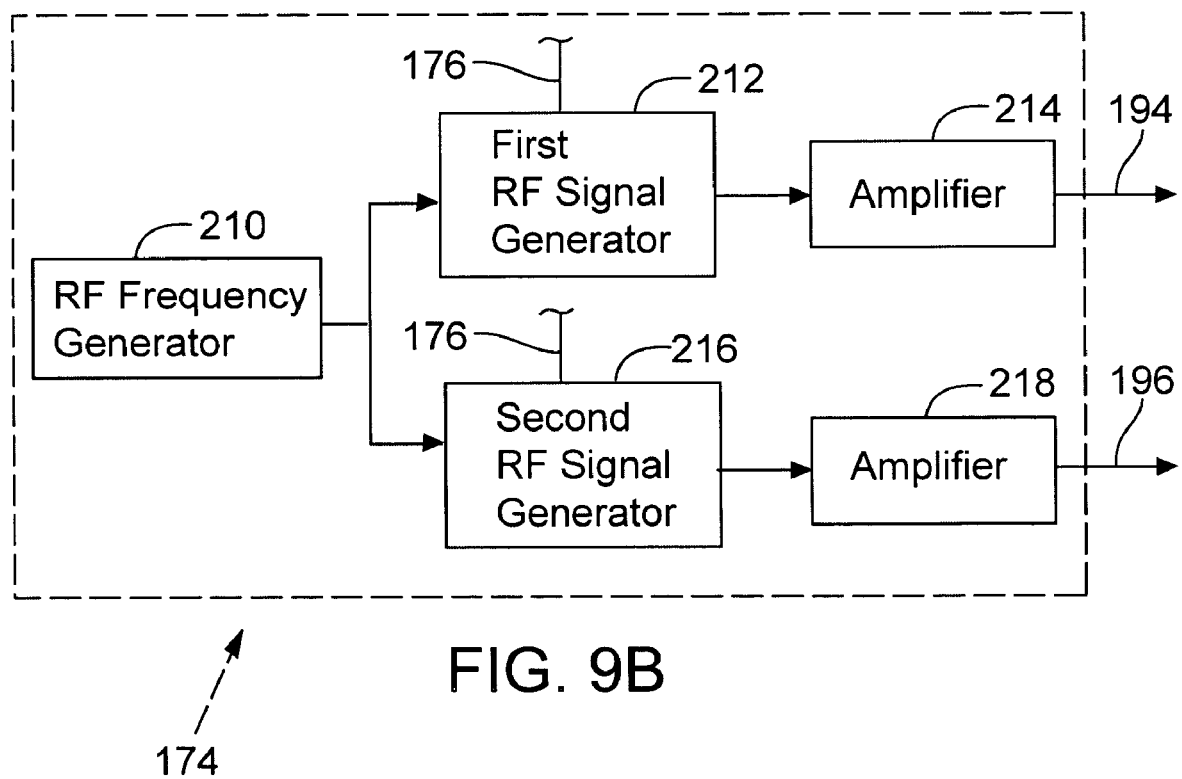

FIG. 9B shows an alternative implementation of RF signal driver 174 composed of an RF frequency generator 210 providing a common Q-switch RF frequency signal to a first RF signal generator 212 and amplifier 214 combination and to a second RF signal generator 216 and amplifier 218 combination. Amplifier 214 provides the RF drive signal along coaxial cable 194 to acousto-optic Q-switch 166, and amplifier 218 provides the RF drive signal along coaxial cable 196 to acousto-optic Q-switch 168. In the alternative implementation, Q-switch RF signal driver 174 uses a common Q-switch RF frequency signal as an input to the different RF signal generators 212 and 214 and their respective power amplifiers 214 and 218 driving the different acousto-optic devices 166 and 168. The difference of Q-switch RF signal cut-off times for the different power amplifiers 214 and 218 can be an integer number times one-half of the Q-switch RF frequency cycle time. In this case, all of the RF signals applied to different laser heads will be cut off at the zero voltage level crossing with, however, a delay time of an integer number times one-half of the Q-switch RF frequency cycle time. This will give a programmable delay time between the laser pulses in steps of a few nanoseconds, depending on the Q-switch RF signal frequency.

Skilled persons will appreciate that when the RF trigger points of RF signal generators 212 and 216 are continuously programmable at the same level or different levels, a continuously programmable delay time between the first and second laser energies can be realized.

After the Q-switch RF signal is cut off, the laser pulse builds up, starting from so-called quantum noise. Because of the random nature of quantum noise, there is random time variation ranging from a few nanoseconds to 10 ns between the time of Q-switch RF signal cut-off and the time when the laser pulse begins building up. To reduce laser pulse jitter stemming from the laser pulse build-up process, an preferred embodiment utilizes a small part of the laser output energy from one laser head (which started its pulse building up earlier than the other) to be injected to the other laser head such that the other laser head pulse build up will start from the injected laser signal, and thereby eliminate the laser build up jitter.

FIG. 3 shows one system configuration of the embodiment, which uses two DPSS lasers coupled by injection locking. Injection locking is performed by using a small part of the laser energy of first laser pulse 62 propagating from laser head 52 (or laser rail 60) through an optical path for injection into laser head 54. The firing of Q-switch 66 of laser head 54 is delayed from the firing of Q-switch 56 of laser head 52. The optical path can include a fiber laser to deliver the injected laser signal. The length of the optical path can be adjusted to deliver the desired delay time between the two laser energies from laser heads 52 and 54. With the injected laser energy of laser head 52, the laser pulse of laser head 54 builds up in response to the injected laser energy, rather than from stimulus by quantum noise in the resonator. Injection locking highly synchronizes the laser pulses of beams 62 and 72 and thereby greatly reduces the relative pulse jitter between them. Dashed line 220 in FIG. 8 represents the injection locking of laser heads 162 and 164 to provide a laser system implemented with both solutions to laser pulse jitter.

The fundamental wavelength of laser head 52 can undergo extra-cavity harmonic conversion into the second or third harmonic wavelength, while the injection laser energy is derived from the fundamental wavelength, which is the same laser wavelength as that of laser head 54. The extra-cavity harmonic conversion implementation is accomplished with use of optional harmonic converter 88 receiving pulsed laser beam 60 from laser head 52 (or laser rail 60).

The timing of the firing of laser head 54 can be electronically controlled relative to the output pulses of laser rail 60 such that the starting point of each of the output pulses of laser rail 70 can be at any time that is in between the starting point and the ending point of the corresponding output pulse of laser rail 60, as shown in FIGS. 4A and 4B, thereby to alter the pulse shape of the formed laser pulse energy profile of FIG. 4C.

The tail of a typical laser pulse, even with a shorter pulse full width at half maximum (FWHM), lasts a relatively long time. For instance, for a laser pulse with a nominal 5 ns pulse width (FWHM), the total laser pulse width (measured from its very beginning and very end of the laser energy) can be as long as 15 ns-20 ns. This provides a substantially wide available range of firing timing of an output pulse of laser head 54. When the optical beam path of the injected laser signal, "A" in FIG. 3, is made longer before injection into laser head 54, the delay between corresponding output pulses of laser heads 52 and 54 can be increased, so the two energy peaks comprising the formed laser pulse energy profile can be temporally totally separated with little jitter, as shown in FIGS. 5A, 5B, and 5C.

Solving both of these aspects of laser pulse jitter allows generation of laser pulses with a specially shaped laser energy profile from multiple laser heads with highly accurate timing and profile stability. For instance, two laser pulses propagating from different laser heads with a time difference in the range of zero to a few hundred nanoseconds can be utilized to generate a laser pulse with an accurate and stable pulse profile shape or "laser energy distribution vs. time." The two laser heads can operate at different laser pulse parameters such as different pulse width, energy per pulse, beam divergence, and different laser wavelengths. The broad flexibility in changing the laser pulse profile shape, distribution of "laser energy vs. time," different divergences, and wavelengths of the resulting laser pulse profile is a very useful tool for variety of applications.

The generation of an accurate and stable laser pulse energy profile consisting of different laser wavelengths is suitable for use in semiconductor memory chip link processing. Increases in quality of link structure processing can be obtained, for instance, using a laser energy of a shorter duration time from a first laser head and a laser energy of a longer duration time from a second laser head to form a laser pulse profile with a fast rising edge and a long pulse width, or a laser profile shape with a spike located somewhere along the profile. With reference again to FIGS. 4A-4C, when the two laser heads operate at different laser wavelengths, according to this invention, one can achieve a laser pulse profile characterized by, for example, laser energy at UV wavelength in a first desired time period of the profile, and laser energy at green or other wavelength in a second desired other time period of the profile. For example, the front part or peak 100 of laser pulse profile 98 is at the UV wavelength, and the back part or peak 102 of laser pulse profile 98 is at the green wavelength. This is very beneficial for the link process for the reasons described above. The preferred wavelength combinations, such as 1064 nm and 1320 nm, UV of 355 nm and near IR of 1064 nm or 1320 nm, for different link structures or different applications, are achievable.

The application system can control the laser pulse profile, its energy components and wavelength components further to facilitate other functions of the system, such as beam-to-work target alignment. For example, for beam-to-work target alignment, the system can enable only the green energy part of the laser pulse profile, or only the UV laser energy part while not enabling the other part of the energy profile to improve contrast and increase signal-to-noise ratio of the reflection from a target feature, thereby increasing alignment accuracy. For link processing, the system makes full use of the laser pulse energy profiling capability.

It will be obvious to those having skill in the art that many changes may be made to the details of the above-described embodiments without departing from the underlying principles of the inventions. The scope of the present inventions should, therefore, be determined only by the following claims.

The invention claimed is:

1. A method of generating a laser pulse with a stable energy profile including a first laser energy feature at first laser wavelength in a first part of the profile and a second laser energy feature at second laser wavelength in a second part of the profile, comprising:

providing a first laser head from which first laser energy at a first wavelength and characterized by a first energy profile feature propagates in response to a first drive signal and a second laser head from which second laser energy at a second wavelength and characterized by a second energy profile feature propagates in response to a second drive signal, the first and second drive signals being developed in synchronism in response to a timing command signal and thereby exhibiting relative jitter in a range that is confined within an operational tolerance;

establishing a delay between the first and second laser energies; and forming a laser output pulse characterized by output pulse energy profile features corresponding at least in part to the first and second energy profile features, the output pulse energy profile features being separated temporally by the delay established between the first and second laser energies.

2. The method of claim 1, in which the first laser emits the first laser energy at a first wavelength and the second laser emits the second laser energy at a second wavelength that is different from the first wavelength.

3. The method of claim 1, further comprising directing the laser output pulse for incidence on a multilayer structure to remove target layer material, and in which the output pulse sequentially ruptures an initial portion of a region of the target layer material and removes a remaining portion of a region of the target layer material.

4. The method of claim 3, in which the target layer material comprises an electrically conductive link.

5. The method of claim 4, in which the first and second wavelengths are within the ultraviolet, visible, or infrared wavelength range and the first wavelength is shorter than the second wavelength.

6. The method of claim 4, in which the first and second wavelengths are within the ultraviolet, visible, or infrared wavelength range and the first and second wavelengths are the same.

7. The method of claim 1, in which the first and second pulse profile features represent respective first and second separate pulse spikes.

8. The method of claim 1, in which the first and second laser heads include respective first and second acousto-optic Q-switches, first and second RF drivers provide the respective first and second drive signals through first and second RF transmission media to the first and second acousto-optic Q-switches in response to the timing command signal, and the first and second drive signals exhibit a relative delay that establishes the delay between the first and second laser energies.

9. The method of claim 8, in which the first and second RF drivers include respective first and second RF amplifiers, the first and second RF amplifiers share a common RF signal from an RF signal generator, the common RF signal is turned off in response to the timing command signal and when the RF signal is crossing its laser firing trigger point, thereby ensuring laser energy stability in a range that is confined within an operational tolerance.

10. The method of claim 8, in which the lengths of the first and second RF cables are chosen to be the same or different based on the desired time delay between the first and second laser energies.

11. The method of claim 8, in which the first RF driver and the second RF driver comprise, respectively, a first RF signal generator and amplifier and a second RF signal generator and amplifier, the first and second RF signal generators share a common RF frequency signal from an RF frequency generator, the first RF signal generator turns off the RF signal to the first amplifier and the first acousto-optic Q-switch in response to the timing command signal and when the RF signal is crossing its zero voltage level, thereby ensuring the first laser energy stability in a range that is confined within an operational tolerance; and the second RF signal generator turns off the RF signal to the second amplifier and the second acousto-optic Q-switch with programmable delay time after the RF signal to the first acousto-optic Q-switch is turned off and when the RF signal is crossing its zero voltage level, thereby ensuring the second laser energy stability in a range that is confined within an operational tolerance, and the delay time being an integer number times a half cycle time of the RF frequency.

12. The method of claim 1, in which the first and second wavelengths are within the ultraviolet, visible, or infrared wavelength range and the first wavelength is shorter than the second wavelength.

13. The method of claim 1, in which the first and second laser heads are coupled by injecting a portion of the first energy into the second laser head.

14. The method of claim 13, in which the injecting laser energy from the first laser head passes through an optical path with length determined by the delay between the first and second laser energies.

15. The method of claim 14, in which the optical includes an optical fiber.

16. The method of claim 1, in which delay time between the first and second laser energies is between zero and about 500 ns.

17. The method of claim 1, in which the laser pulse has leading edge rising time of shorter than about 10 ns and a total duration of longer than about 5 ns.

18. The method of claim 1, in which the first laser energy lasts from 1 ps to 100 ns and the second laser energy lasts from about 1 ps to about 100 ns.

19. The method of claim 1, in which the operational tolerance of the pulse jitter range is about 10 ns.

20. The method of claim 1, in which the operational tolerance of the laser energy stability is about ±10%.

* * * * *